United States Statutory Invention Registration [19]

[11] Reg. Number: H307

Epure, deceased et al. [43] Published: Jul. 7, 1987

[54] HIGH "G" ELECTRONICS SYSTEM

[75] Inventors: Stefan T. Epure, deceased, late of San Marino, by Gertrude M. Epure, executrix; Lee K. Clark, Santa Ana; James P. Haine, Tustin, all of Calif.

[73] Assignee: The United States of America as represented by the Secretary of the Army, Washington, D.C.

[21] Appl. No.: 877,945

[22] Filed: Jun. 23, 1986

[51] Int. Cl.[4] ..... H05K 5/06; B29C 43/18; H05K 1/14

[52] U.S. Cl. ..... 174/52 PE; 264/272.11; 361/395

*Primary Examiner*—Stephen C. Buczinski
*Assistant Examiner*—Linda J. Wallace
*Attorney, Agent, or Firm*—Anthony T. Lane; Harold H. Card, Jr.; Michael C. Sachs

[57] ABSTRACT

The invention concerns a technique and apparatus for protecting sensitive electronic components against the high accelerations encountered in a tank-powered projectile, for instance. A first ring is placed on a circuit board and filled with an RTV compound. A cap is placed on the first ring to force excess RTV compound from the first ring, and is removed once the RTV compound cures. A second shorter ring is placed about the RTV compound and is attached to the circuit board. A flat plate is then used to press the RTV compound into any voids which may exist between elements mounted on the circuit board. Circuit modules created in this manner may be stacked upon one another and interconnected.

21 Claims, 6 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HIGH "G" ELECTRONICS SYSTEM

GOVERNMENTAL INTEREST

The Government has rights in this invention pursuant to Contract No. DAAA-09-77-C-2043 awarded by the Department of the Army.

BACKGROUND OF THE INVENTION

The invention concerns an apparatus and technique for protecting sensitive electronic components against the high accelerations encountered in a tank-fired projectile, for instance.

In most applications involving electronics in high launch force environments, the components are mounted on circuit boards, the interconnects between boards and components are made, and the entire module is solid potted with a suitable resin. This method has at least two notable shortcomings. In the event of a component failure, or if for any reason it is required to replace a component internal to the potted module, access to the component may require an arduous effort to remove the potting, a process which often damages other components and compromises the integrity of the total structure. Additionally, the standard method does not provide for special shock isolation of especially fragile components. The technique described eliminates both of these deficiencies and also enables the attenuation of selected frequency regions resulting from the applied accelerations.

Hardening of components and assemblies is based on the response shock spectrum to obtain the required frequency for proper design of the shock isolation system. In order to specify the optimum isolation for a particular assembly, it is necessary to determine the mass properties of the assembly along with those of the shock isolation system. In order to specify the optimum isolation for a particular assembly, it is necessary to determine the mass properties of the assembly along with those of the critical components comprising it. This information relates to the susceptibility of a given component to failure by shock loading as a function of the frequency content of the applied load. By analyzing the frequency content of the applied load, it is possible to construct a convenient analytical representation of the shock pulse that will produce this spectrum of response. In this form, the load spectrum can be analytically applied to the assembly to determine the response of that assembly. To minimize the risk of damage to the assembly, it is required to attenuate frequency regions in the applied load that correspond to critical frequency regions in the specimen.

It is the purpose of the present invention to eliminate the correspondence of such spectra and to demonstrate a methodology involving selected non-linear elastomer springs which produce the desired isolation.

SUMMARY OF THE INVENTION

The invention concerns a technique and apparatus for protecting sensitive electronic components against the high accelerations encountered in a tank-fired projectile, for instance.

An assembly of circuit elements mounted on a circuit board which has been potted may contain many voids between the elements,leads, potting, and/or boards. Such voids may create weak spots in the assembly, which enhance the possibility of circuit failure when subjected to high acceleration. In order to fill these voids, a first ring is connected to the board and filled with an RTV compound. A specifically shaped cap is placed upon the RTV in a manner which causes a predetermined access of the RTV to be forced out holes in the first ring. Once the RTV has cured, the first ring is removed and replaced with a second, shorter ring. A flat plate is then pushed down upon the cured RTV, forcing the RTV compound into any voids. A second circuit board may be mounted on top the second ring once the flat plate has been removed, and electrically connected to the first board.

DETAILED DESCRIPTION OF THE INVENTION

Figure 1:
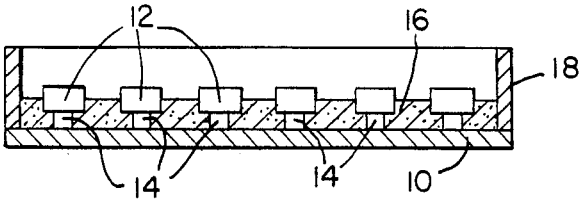
FIG. 1 shows a circuit board having circuit elements which have been potted, with a first ring mounted thereto.

The construction technique is a process of applying to each circuit board a thin layer of semi-rigid potting compound which is caused to fill all voids under the components by the application of vacuum to the assembly in order to provide uniform support. Following a curing process in an elevated temperature environment, the assembly is coated with mold release, placed within a containment ring, and filled to the upper surface of the ring with a RTV compound. Next, on top of the RTV-filled assembly is placed a mold cap which has concentric circular protrusions, the purpose of which is to displace a specified quantity of the RTV. Following the curing of the RTV pad, the ring is removed and replaced by a ring which has less height. The height of this replacement ring is exactly that required to allow displacement of the excess RTV (that extending above the containment ring) by a force applied to a flat plate covering the exposed RTV to the extent that the voids in the pad are no longer present. The purpose of this procedure is to apply a preloading of each assembly such that it is uniformly supported on both sides by a firm but compliant substance. The details of this construction are shown in FIG. 1. The values of $h_1$ and $h_2$ are determined by specifying the amount of force to be uniformly applied to the top and bottom of each board in the stack when fully assembled and compressed. Owing to the relative incompressability of certain RTV mixtures, it is possible to achieve a condition in which the difference in height between the molding ring ($h_1$) and the assembly ring ($h_2$) is just sufficient to cause the flowing RTV to fill all the molded-in voids with the application of force from above.

FIG. 1 shows a circuit board 10 to which circuit elements 12 are mounted, and connected to one another via component leads 14. Semi-rigid potting 16 has been added to secure all connections, electrical and physical. In spite of the potting 16, numerous voids may occur between the board, elements, and leads. In accordance with the present invention, a first molding ring 18 is connected to the circuit board 10, in a manner which surrounds the circuit elements 12 and leads 14. It is apparent to those of ordinary skill in the art that the first molding ring 18 may take a variety of shapes, but must comprise some sort of walled structure.

Figure 2:
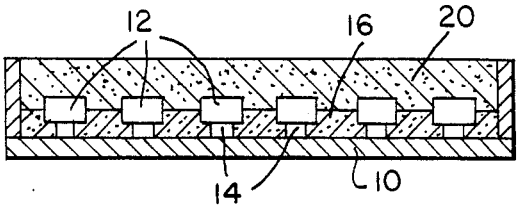
FIG. 2 shows the assembly of FIG. 1 filled with an RTV compound.
Figure 3:
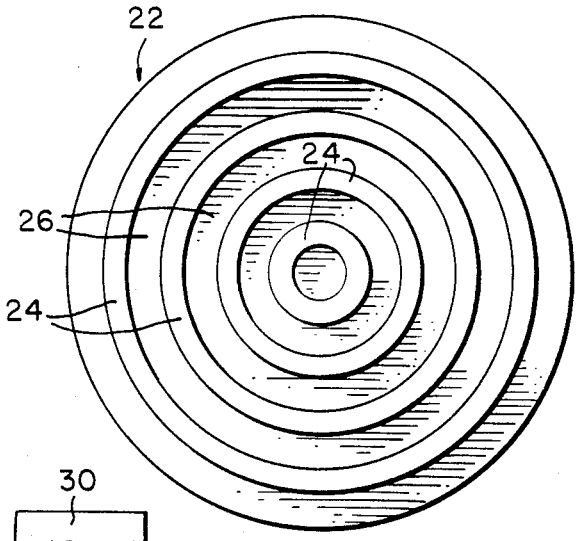
FIG. 3 shows a mold cap, plan view.
Figure 4:
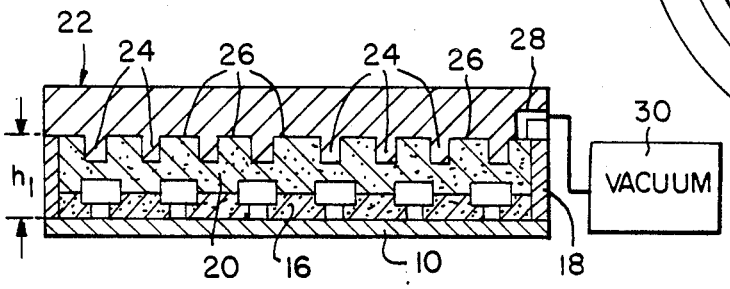
FIG. 4 shows the mold cap of FIG. 3 forced upon the assembly of FIG. 2.

In FIG. 2 an insulating RTV compound 20 has been added, filling the first molding ring 18. FIG. 3 shows a molding cap 22 which is the same diameter as the first molding ring 18 and is round to fit upon the first molding ring 18. The cap molding 22 is provided with a series of circular, concentric ridges 24 and channels 26. The relationship of these ridges 24 and channels 26 is better seen in FIG. 4. In FIG. 4 the cap 22 has been placed upon the molding ring 18. It is apparent that, owing to the ridges 24, an excess amount of the RTV compound 20 is forced from within the first molding ring 18. A hole 28 may be provided in the molding cap 22 to provide an egress for the excess RTV compound 20. Hole 28 is typical of others which are not shown for purposes of simplicity. To facilitate the egress of the excess RTV compound 20, a vacuum creating means 30 may be attached to the holes 28, for evacuating the RTV compound 20 therethrough.

Figure 5:
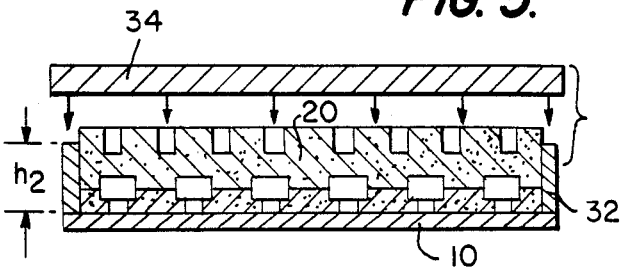
FIG. 5 shows a second, shorter ring connected to the circuit board, and a flat plate pressed toward the RTV compound.

FIG. 5 reveals that the RTV compound 20 has taken a shape which is complementary to the molding cap 22, once the RTV compound 20 has cured. A second, shorter ring 32 is now attached to the circuit board 10, above which the cured RTV compound 20 extends. A flat plat 34 is placed upon the cured RTV and is pressed or pushed downward. Such a downward motion applied by the flat plate 34 causes the RTV compound 20 to be forced into any and all voids occurring between the circuit board 10, circuit elements 12, and leads 14.

Figure 6:
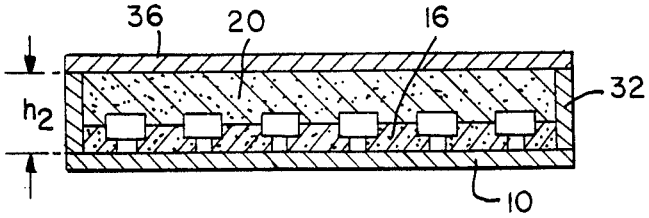
FIG. 6 shows a circuit assembly prepared in accordance with the present invention.

FIG. 6 shows that the flat plate 34 has been removed and a second circuit board 36 has been placed upon the second ring 32. In this manner, circuit modules may be created which may be stacked upon one another. Wires connectinq circuits on other boards in the stacked module, and those routed through the module to external circuits, are passed through holes at the edge of each board. During the molding stages, both the semi-rigid potting and RTV, it is necessary to temporarily fill these holes with a suitable gum-like substance to avoid the leakage of the molding material. This filler substance is removed after the molding processes are completed. The module is made complete by assembling the P.C. boards, which are connected together by wires and between which are placed the pre-molded RTV pads. Screws extending the length of the module through metal discs on the top and bottom are tightened to produce the desired degree of compression.

Modifications to the present invention are apparent to those skilled in the art, which do not depart from the spirit of the present invention. The scope of the invention is defined by the appended claims.

What is claimed is:

1. For a potted circuit board having elements connected by leads, an assembly including:

a first walled means for surrounding the elements and connected to the circuit board;

an insulating means for insulating the elements, filling the first walled means;

a cap means for closing the first walled means, which when placed upon the first walled means extends slightly within the first walled means;

a venting means via which an excess of the insulating means travels with the cap closed;

a second walled means shorter than and for replacing the first walled means about the insulating means, and connected to the circuit board; and a pressing means for pressing the insulating means toward the circuit board until contacting the second walled means.

2. An assembly as in claim 1, the first walled means comprising a molding ring.

3. An assembly as in claim 2, the shock insulating compound comprising an RTV compound which fills the molding ring.

4. An assembly as in claim 3, the cap means comprising a round molding cap.

5. An assembly as in claim 4, the molding cap having a circular and concentric structure thereon.

6. An assembly as in claim 5, the circular and concentric structure comprising an alternating series of channels and ridges.

7. An assembly as in claim 6, the venting means comprising a hole in the molding cap through which the excess RTV compound travels.

8. An assembly as in claim 7, the venting means including a vacuum means connected to the hole, for evacuating the excess RTV compound.

9. An assembly as in claim 8, the second walled means comprising a second ring, shorter than the molding ring which is engaged in the molding cap.

10. An assembly as in claim 9, the pressing means comprising a flat plate which presses the RTV compound toward the circuit board, until contacting the second ring.

11. A method for assembling a potted circuit board having elements connected by leads, the steps including:

surrounding the elements with a wall;

filling the wall with an insulating material;

capping the wall;

forcing an excess of the insulating material from within the wall;

surrounding the insulating material with a second ring;

pressing the insulating material toward the circuit board.

12. The method as in claim 11, including surrounding the elements with a molding ring.

13. The methods as in claim 12, including filling the molding ring with a RTV compound.

14. The method as in claim 13, including capping the wall with a round cap.

15. The method as in claim 14, includinq capping the wall with a cap having a circular and concentric structure thereon.

16. The method as in claim 15, including capping the wall with a circular and concentric structure having an alternating series of ridges and channels, and forming a complementary series of channels and ridges in the RTV compound.

17. The method as in claim 16, including forcing an excess of the RTV compound through holes in the molding cap.

18. The method as in claim 17, including evacuating the excess RTV compound through the holes with a vacuum.

19. The method as in claim 18, including curing the RTV compound.

20. The method as in claim 19, including removing the molding ring and surrounding the elements with a second, shorter ring.

21. The method as in claim 20, including pressing the cured RTV compound with a flat plate.

* * * * *